United States Patent
Fidaner et al.

(10) Patent No.: US 9,142,615 B2
(45) Date of Patent: Sep. 22, 2015

(54) METHODS AND APPARATUS FOR IDENTIFYING AND REDUCING SEMICONDUCTOR FAILURES

(71) Applicant: SOLAR JUNCTION CORPORATION, San Jose, CA (US)

(72) Inventors: Onur Fidaner, Sunnyvale, CA (US); Daniel Derkacs, Sunnyvale, CA (US); Paul F. Lamarche, Morgan Hill, CA (US); Michael W. Wiemer, Campbell, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 14/051,149

(22) Filed: Oct. 10, 2013

(65) Prior Publication Data

US 2014/0097522 A1    Apr. 10, 2014

Related U.S. Application Data

(60) Provisional application No. 61/712,159, filed on Oct. 10, 2012.

(51) Int. Cl.

| | |
|---|---|
| *H01L 29/06* | (2006.01) |
| *H01L 21/764* | (2006.01) |
| *H01L 31/0687* | (2012.01) |
| *G01R 31/40* | (2014.01) |

(52) U.S. Cl.
CPC .......... *H01L 29/0657* (2013.01); *H01L 21/764* (2013.01); *H01L 31/0687* (2013.01); *H02S 50/00* (2013.01); *Y02E 10/544* (2013.01)

(58) Field of Classification Search
CPC . H01L 22/32; H01L 31/0508; H01L 31/0352; H01L 31/0201; H01L 31/02021; H01L 21/764; H01L 29/0657
USPC ............................ 136/255; 438/412; 257/623
See application file for complete search history.

(56) References Cited

U.S. PATENT DOCUMENTS

| | | |
|---|---|---|
| 4,838,952 A | 6/1989 | Dill et al. |
| 5,266,518 A | 11/1993 | Binsma et al. |
| 6,281,426 B1 | 8/2001 | Olson et al. |

(Continued)

FOREIGN PATENT DOCUMENTS

| | | |
|---|---|---|
| CN | 101051656 A | 10/2007 |
| EP | 1953828 A1 | 10/2007 |

(Continued)

OTHER PUBLICATIONS

Non-Final Office Action for U.S. Appl. No. 13/283,379, mailed on Feb. 6, 2013, 11 pages.

(Continued)

*Primary Examiner* — Shaun Campbell

(57) ABSTRACT

The present disclosure provides multi-junction solar cell structures and fabrication methods thereof that improve electrical testing capability and reduce chip failure rates. In the present invention a special masking pattern is used in the layout such that all or some of the epitaxial layers are etched away in the corner areas of each solar cell. Consequently, the semiconductor substrate or one or more of the interconnections between junctions become accessible from the top (the side facing the sun) to make electrical connections.

17 Claims, 16 Drawing Sheets

(56) References Cited

U.S. PATENT DOCUMENTS

| | | | |
|---|---|---|---|
| 7,727,795 B2 | 6/2010 | Stan et al. | |
| 8,115,097 B2 | 2/2012 | Guha et al. | |
| 2004/0166681 A1 | 8/2004 | Iles et al. | |
| 2006/0231130 A1 | 10/2006 | Sharps et al. | |
| 2008/0276981 A1 | 11/2008 | Kinoshita et al. | |
| 2009/0038671 A1* | 2/2009 | Yamaguchi | 136/244 |
| 2009/0269875 A1* | 10/2009 | Kato et al. | 438/58 |
| 2010/0089447 A1 | 4/2010 | Basol et al. | |
| 2010/0126573 A1 | 5/2010 | Youtsey et al. | |
| 2010/0212729 A1 | 8/2010 | Hsu | |
| 2010/0218816 A1 | 9/2010 | Guha et al. | |
| 2010/0282305 A1 | 11/2010 | Sharps et al. | |
| 2010/0319764 A1 | 12/2010 | Wiemer et al. | |
| 2011/0108082 A1 | 5/2011 | Werthen et al. | |
| 2011/0303281 A1 | 12/2011 | Kodama | |
| 2011/0308599 A1 | 12/2011 | Stangl | |
| 2012/0019596 A1 | 1/2012 | Lee et al. | |
| 2012/0040487 A1 | 2/2012 | Asthana et al. | |
| 2013/0105930 A1 | 5/2013 | Zhang et al. | |
| 2013/0118546 A1 | 5/2013 | Jones-Albertus et al. | |
| 2013/0122638 A1 | 5/2013 | Jones-Albertus et al. | |
| 2013/0263920 A1 | 10/2013 | Fidaner et al. | |
| 2013/0312817 A1 | 11/2013 | Fidaner et al. | |
| 2014/0137930 A1 | 5/2014 | Derkacs et al. | |
| 2014/0196779 A1 | 7/2014 | Fidaner et al. | |

FOREIGN PATENT DOCUMENTS

| | | |
|---|---|---|
| EP | 1990839 A2 | 11/2008 |
| JP | 2000-150929 A | 5/2000 |
| JP | 2005-535148 A | 11/2005 |
| JP | 2011-526737 A | 10/2011 |
| KR | 10-2011-0128155 A | 11/2011 |
| KR | 10-1193810 B1 | 10/2012 |
| WO | 2011-156017 A1 | 12/2011 |

OTHER PUBLICATIONS

Final Office Action for U.S. Appl. No. 13/283,379, mailed Jul. 1, 2013, 13 pages.
Non-Final Office Action for U.S. Appl. No. 13/283,379, mailed on Nov. 18, 2013, 11 pages.
Chen et al., "Cu-plated through-wafer vias for AlGan/GaN high electron mobility transistors on Si", Journal of Vacuum Science and Technology B, vol. 27, Issue 5, 2009, 5 pages.
Danzilio, "Overview of EMCORE's Multijunction Solar Cell Technology and High Volume Manufacturing Capabilities", The International Conference on Compound Semiconductor Manufacturing Industry, 2007, 4 pages.
Van Kerschaver et al., "Back-contact Solar Cells: A review", Progress in Photovolataics: Research and Applications, vol. 14, 2006, pp. 107-123.
Zaknoune et al., "Nonselective wet chemical etching of GaAs and AlGaInP for device application", J. Vac. Sci. Technol. B 16, 223, 1998, 4 pages.
Law et al., "Future technology pathways of terrestrial III-V multijunction solar cells for concentrator photovoltaic systems," Solar Energy Materials & Solar Cells, vol. 94, 2010, p. 1314-1318.
Szabo et al., "InGaAsP/InGaAs tandem cells for a solar cell configuration with more than three junctions", Phys. Stat. Sol. (RRL) 2, No. 6, Jul. 2008, p. 254-256.
Zahler et al., "High efficiency InGaAs solar cells on Si by InP layer transfer," Applied Physics Letters, 91, 012108, 2007, 3 pages.
Ptak et al., "Effects of temperature, nitrogen ions, and antimony on wide depletion width GaInNAs," Journal of Vacuum Science Technology, B 25(3), May/Jun. 2007, p. 955-959.
Aiken, "High Performance anti-reflection coatings for broadband multi-junction soalr cells", Solar Energy Materials and Solar Cells, vol. 64, 2000, p. 393-404.
Aiken, "Antireflection coating design for series interconnected multi-junction solar cells" Progress in Photovoltaics: Research and Applications, vol. 8, Issue 6, 2000, p. 563-570.
Li et al., "Surface profile optimization of anti-reflection gratings for solar cells", Optik-int. J. Light Electron Optik, vol. 122, 2011, p. 2078-2082.
Moys, "The theory of double-layer antireflection coatings", Thin Solid Film, vol. 21, 1974, p. 145-157.
International Search Report and Written Opinion for PCT/US2013/035123, mailed on Jun. 21, 2013, 12 pages.
International Search Report and Written Opinion for PCT/US2014/029494, mailed on Jul. 21, 2014, 19 pages.
Final Office Action for U.S. Appl. No. 13/283,379, mailed on Apr. 30, 2014, 12 pages.
Non-Final Office Action for U.S. Appl. No. 13/679,922, mailed on Apr. 10, 2014, 17 pages.
International Search Report and Written Opinion for PCT/US2013/070323, mailed on Feb. 17, 2014, 16 pages.
Final Office Action for U.S. Appl. No. 13/679,922, mailed on Dec. 16, 2014, 14 pages.
Search Report and Written Opinion for Taiwan Application No. 102112423, mailed on Feb. 16, 2015, 3 pages.

* cited by examiner

METHODS AND APPARATUS FOR IDENTIFYING AND REDUCING SEMICONDUCTOR FAILURES

This application claims the benefit under 35 U.S.C. §119 (e) of U.S. Provisional Application No. 61/712,159 filed on Oct. 10, 2012, which is incorporated by reference in its entirety.

FIELD

The present invention relates to semiconductor devices wherein epitaxial regions on semiconductor substrates are isolated to make multiple devices on a substrate.

BACKGROUND

Conventional multi-junction solar cells are widely used for terrestrial and space applications and provide the highest efficiency for solar energy conversion. Multi-junction solar cells comprise multiple p-n or n-p diodes (junctions) in series connection, realized by growing thin regions of epitaxy in stacks on semiconductor substrates. Each junction in a stack is optimized for absorbing a different portion of the solar spectrum, thereby improving the efficiency of solar energy conversion. These types of structures are varied and are well known to those skilled in the art.

Typical fabrication steps in state-of-the-art multi-junction solar cell processing have been described by D. Danzilio et al. "Overview of EMCORE's Multi-junction Solar Cell Technology and High Volume Manufacturing Capabilities", CS MANTECH Conference, May 14-17, 2007, Austin, Tex., USA. Multi-junction solar cell fabrication generally involves two parts; namely, front-end and back-end processing. Front-end processing includes growth of epitaxial layers, front and backside metallization, and solar cell die isolation. Standard semiconductor fabrication techniques are used in front-end processing, which yields multiple solar cell die on a semiconductor wafer. The die are electrically isolated and the cells are fully functional. Back-end processing includes steps such as singulation of cells on the wafer (e.g. using dicing blade), packaging, and wirebonding.

FIG. 1A shows a top view of a prototypical multi-junction solar cell die (prior art) after front-end processing. FIG. 1B shows the side view of the cross-section 9 in FIG. 1A. Solar cell die 100 are typically rectangular in shape and are laid out on wafer 5 using a grid pattern. A regular rectangular grid is preferred to yield the maximum number of cells of a given size on the wafer. Metal busbars 22 and gridlines 2 sit on a mesa structure 6, which is obtained by partially or completely eliminating epitaxial layers 4 along the outer edges of each die 100. This process step is referred to as the "mesa isolation process". The die on the wafer are electrically isolated as a result of mesa structure formation. The mesa isolation process leaves an exposed region 8 of the underlying substrate that runs near and parallel to the edges of the mesa structures 6. The width y of the exposed corner regions 8 is typically on the order of tens of micrometers and these regions serve as dicing streets. Dicing streets are narrow pathways along which the wafer is to be cut during back-end processing to singulate the die on the wafer. A metal contact region 52 is provided on the backside of the substrate 5 and serves as an electrode. The other electrodes are the busbars 22, which are typically located along one or more edges of each die. Multijunction solar cells typically have additional features as well, such as anti-reflection coating (not shown in FIGS. 1A and 1B) and cap regions 3. Cap regions 3 are patterned epitaxial regions underlying metal gridlines 2 to provide an electrical contact between the metal and the underlying semiconductor structure 41. Such features and structures are well known to those skilled in the art.

The active area of a solar cell is defined as the area that actually absorbs the sunlight and generates photocurrent. The active area includes the grid of thin metal lines 2 placed in parallel or in other configurations but excludes the areas occupied by the busbars 22. Consequently, the areas under the busbars do not contribute to the generated electrical power. Henceforth, the active area is the area of the mesa 6 less the area of the busbars 22. In the design of multi-junction solar cells, busbar width x is chosen using engineering practices such that current is collected with minimal resistive losses, wirebonding requirements are fulfilled, and the busbars occupy a small area on the die.

In the prior art, typical testing procedure includes voltage and current measurements that are conducted while the cell is illuminated from the top with a solar simulator. Voltage and current measurements can be done after front-end processing (wafer scale) as well as after singulation of solar cell die. These measurements are important to determine and eliminate defective die before packaging. Prior art solar cells have features that reduce the accuracy of electrical measurements.

Multi-junction solar cells (prior art) typically have two electrodes. The top electrode consists of the busbars 22 and the gridlines 2 and the bottom electrode consists of the metal coating 52 on the backside. The junctions 41, 42, and 43 are serially connected through the epitaxy. Voltage contributions of individual junctions cannot be measured, merely the total voltage difference across all junctions can be measured. In addition, certain features of the test setup negatively impact the accuracy of voltage measurements.

Wafer scale measurements are typically done when the wafer is placed on a vacuum chuck. Henceforth, the metal-coated back surface of the wafer makes electrical contact with the chuck. Electrical measurements are done through microscopic mechanical contacts (pins or probes, typically on a probe card) on the top electrode (busbars) and through the chuck on the back electrode. Voltage and current are typically measured using independent pins. For voltage measurements, contact resistance between the chuck and the back metal and the resistance of the chuck play an important role. Multi-junction solar cells used in concentrated photovoltaic applications are typically high-current devices. The current may result in a significant voltage drop on the chuck due to the resistance. The voltage measured in the test setup is the total voltage including the voltage drop across the chuck. The voltage component coming from the chuck reduces the accuracy of the measurement of the actual solar cell voltage, which is the voltage across the junctions.

Voltage measurements on singulated cells have additional challenges. FIG. 2 shows a schematic of a diced chip 101 being tested on a vacuum chuck 13. The back metal 52 (back electrode) is in contact with the chuck 13 and the probe card 12 is in contact with the busbar 22 (top electrode). For singulated cells, typically the vacuum pull is not strong enough to ensure a good electrical contact between the chuck and the chip. The downward pressure coming from the probe card 12 may prevent a portion of the backside of the chip 101 from making contact with the chuck 13. These effects result in increased contact resistance between the chuck 13 and the backside 52 of the chip, resulting in a higher voltage drop due to photo-generated current. Furthermore, the contact resistance between the chuck 13 and the solar cell chip 101 is inconsistent from run to run. Therefore, as a consequence there is increased inaccuracy in voltage measurements for singulated die compared to full-wafer testing.

One way to eliminate the uncertainty in voltage measurements is to probe the substrate only from the top for voltage measurements. In this measurement configuration, the path of the photo-generated current stays the same. Referring to FIG. 3, the path of the current I includes the junctions 4, the substrate 5, the contact between the back metal 52 and the chuck 13, and through the chuck 13, each with an associated voltage drop. The voltage V is measured using a probe 14 in contact with the exposed areas 81 on the substrate and another probe (not shown in FIG. 3) in contact with the busbars 22. The voltage measured does not include variations coming from the resistance of the chuck-back contact interface 53 and the resistance of the chuck 13. The contact resistance of the busbars 22 and the contact regions 3 is typically small. The resistance of the contact 145 between the voltage probe 14 and the substrate 5 must also be small. However, since the contact 145 is not on the current flow path, there is much smaller current flowing through this contact compared to other contacts. Consequently, variations in the resistance of the contact 145 do not result in significant uncertainty in voltage measurements. Nevertheless, it may be preferred to provide a metal contact region (not shown in FIG. 3) on the surface 81 of the exposed substrate to facilitate probing. It may also be preferred to flow short pulses of high current for "burning" contacts, to thereby provide a low resistance path between the probe and the substrate.

Probing the substrate from the top typically improves the accuracy of voltage measurements; however, it is not the preferred method in the prior art. Referring to FIG. 1A, the regions 8, where the substrate is exposed, isolate devices on the wafer and serve as dicing streets. There is a requirement to yield the maximum number of chips per wafer in order to minimize manufacturing costs. Consequently, there is a requirement to make y as small as possible; hence the exposed substrate regions 8 occupy a minimum area on the wafer. The width y of the regions 8 is typically chosen to be on the order of tens of micrometers to ensure electrical isolation and fulfill dicing requirements. It is generally difficult to probe the substrate from narrow exposed corner regions. Nevertheless, for wafer scale measurements the width y of the exposed corner regions 8 might be sufficient such that the substrate can be probed by using small probe tips. Although, in many cases it will be difficult to align the probe and the devices on the wafer and the devices can be damaged during testing. On the other hand, for singulated chips (FIG. 3), the exposed substrate region 81 has a much smaller width z compared to y. This is because, after singulation the total width y is shared between two adjacent die and also some of the substrate material is removed during dicing. Therefore, probing the substrate from the top will be much more challenging for singulated chips. For both wafer-scale and singulated cell measurements, if larger substrate probing areas are used, fewer chips can be placed on the wafer. Therefore, front side voltage probing is not a preferred method in the prior art.

In typical multi-junction solar cells, the voltage contribution of individual junctions cannot be determined. The ability to measure the voltage drop on each junction is desirable to determine the root cause of failures and to optimize the performance of solar cell devices. For such voltage measurements, it is required to probe the interconnection regions between junctions. This can be achieved by a layout modification such that the epitaxial material is partially removed in certain areas around the cell so that interfacial epitaxy regions between junctions become exposed and accessible from the top. Such a layout change requires dedicating real estate on the wafer, which can reduce the number of solar cells of a given active area yielded per wafer. Consequently, the voltage contribution of individual junctions is not typically measured in the prior art.

In multi-junction solar cell characterization, it may be desirable to obtain certain electrical measurements without a back metal contact 52. For example, such a requirement may come from a process sequence that includes thinning down the substrate 5 (e.g. by lapping and/or grinding). In such a case, the back metal 52 is provided subsequent to the substrate thinning step. To reduce processing costs, it can be desirable to identify defective devices and low-yield wafers through electrical measurements before the substrate is thinned down. A sacrificial back contact metallization (to be removed before substrate thinning) can be used. However, this approach results in additional cost and complexity in the process.

In summary, there are problems in the prior art of multi-junction solar cell characterization, which are as listed as follows:

1. Using back contacts for voltage measurements adds uncertainty to voltage measurements because of the voltage drop on the test chuck and across the solar cell—test chuck interface.
2. The uncertainty in measured voltage is even more pronounced for singulated cells because of additional resistance at the solar cell—test chuck interface.
3. Probing the substrate from the top can eliminate the uncertainty in voltage measurements. However, this approach typically requires dedicating additional real estate on the wafer, reducing the number of chips yielded from each wafer.
4. Measurement of the voltage contribution of individual junctions in a multi-junction stack is desirable, but typically requires allocating real estate on the wafer, thereby reducing the number of chips yielded per wafer.
5. It is desirable in some process flows to conduct certain electrical measurements without a back contact.

Thermal runaway is a phenomenon that reduces the lifetime and reliability of semiconductor devices. The power dissipated in a semiconductor device is often released as heat, resulting in an increase in the temperature of a device. In certain semiconductor devices, such as diodes and multi-junction solar cells, the increased temperature may result in an even greater increase in the power dissipated. Such a positive feedback loop typically results in the destruction of the semiconductor device. This process is referred to as "thermal runaway" in semiconductor terminology.

Solar cells tested under sun or under electrical forward bias show a common failure pattern of thermal runaway. Typical III-V solar cell die are bonded to a heatsink before on-sun or forward bias testing. Thermal runaway induced failure may result from an imperfect die-attach process whereby one corner of a die is physically higher than the other three with increased thermal resistance in that corner. The corner of the cell which is the highest will heat up more and consequently thermal runaway failure will occur in that corner. The heating consequences of an imperfect die-attach are further exacerbated by the fact that much of the forward bias current flows under the busbars of the chip, and these busbars typically extend into the corners of the chip.

Both electrical testing and thermal runaway problems of the prior art are addressed by the present invention.

SUMMARY

The present invention provides a structure and method to facilitate and improve semiconductor device testing, identify device failures, and mitigate thermal runaway failures. The structure and method are applicable to high-power semiconductor devices comprising epitaxial layers grown on a substrate, wherein the current flows through the substrate. Such semiconductor devices include multi-junction solar cells.

The present invention entails masking layout changes to modify multi-junction solar cell fabrication without changing the active area or reducing the number of chips yielded per wafer. According to the invention, some or all of the epitaxial layers in the corners of each chip are removed (in addition to regular isolation regions or dicing streets surrounding the cells). The busbars are patterned such that they are contained within the borders of the new mesa shape with clipped corners.

In certain aspects, methods for making a semiconductor device are provided, comprising providing a wafer comprising a substrate with a semiconductor device comprising epitaxial regions; patterning the semiconductor device in a mesa isolation pattern to provide exposed areas; etching away the semiconductor device in the exposed areas according to the mesa isolation pattern to provide a mesa structure; patterning the wafer in a corner exposure pattern to define one or more exposed corners of the mesa structure; and etching away part or all of the semiconductor device according to the corner exposure pattern to provide one or more exposed corner regions.

In certain aspects, semiconductor devices are provided comprising a clipped mesa structure comprising one or more exposed corner regions, wherein the one or more exposed corner regions comprises an exposed substrate region, an exposed epitaxial region, or a combination thereof; and one or more metal contacts disposed on the exposed substrate region, the exposed epitaxial region, or both the exposed substrate region, and the exposed epitaxial region.

BRIEF DESCRIPTION OF THE DRAWINGS

In the following description reference is made to the accompanying drawings which form a part hereof wherein like numerals designate like parts throughout, and in which is shown by way of illustration specific embodiments in which the invention may be practiced.

DETAILED DESCRIPTION

Figure 4A:
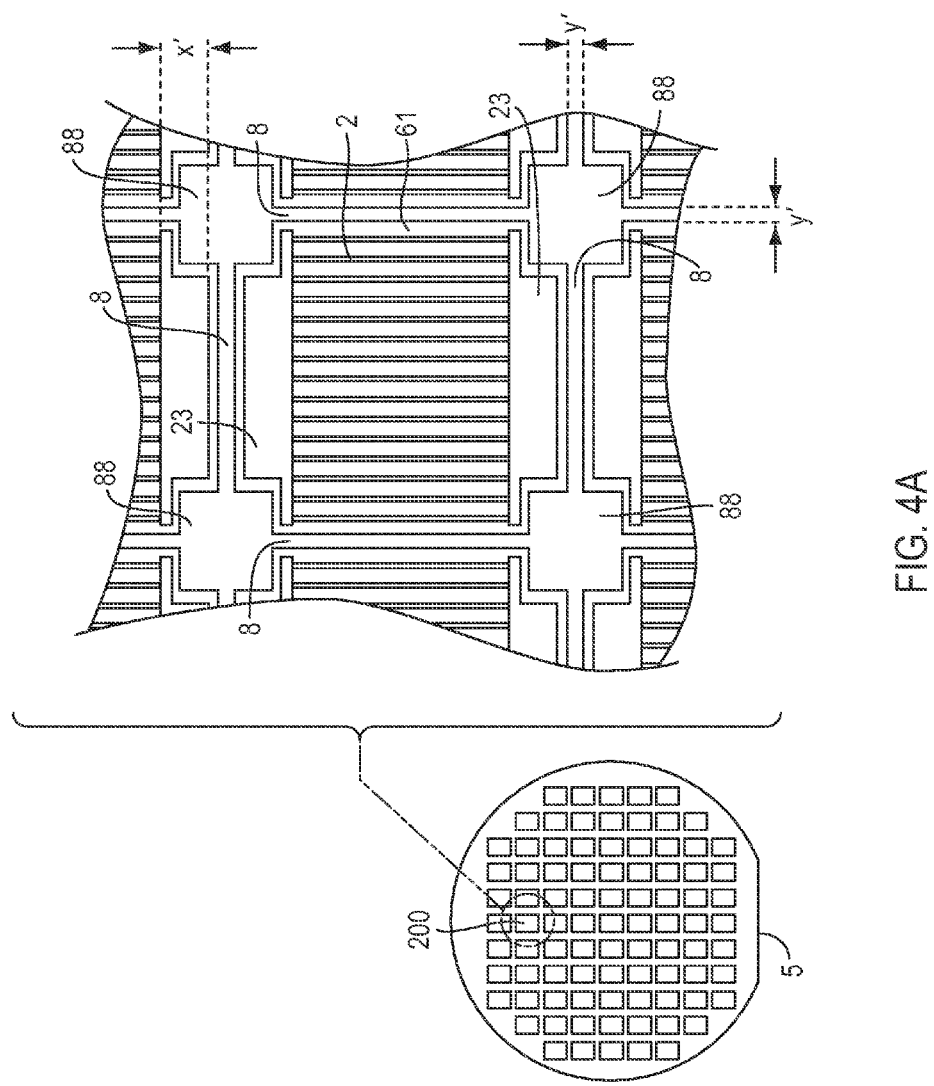
FIG. 4A is a plan view of solar cell devices 200 of the present invention before singulation. The epitaxial regions in the corners of the mesa 61 are removed to expose the substrate in the areas 88 and provide access to the substrate from the top.
Figure 4B:
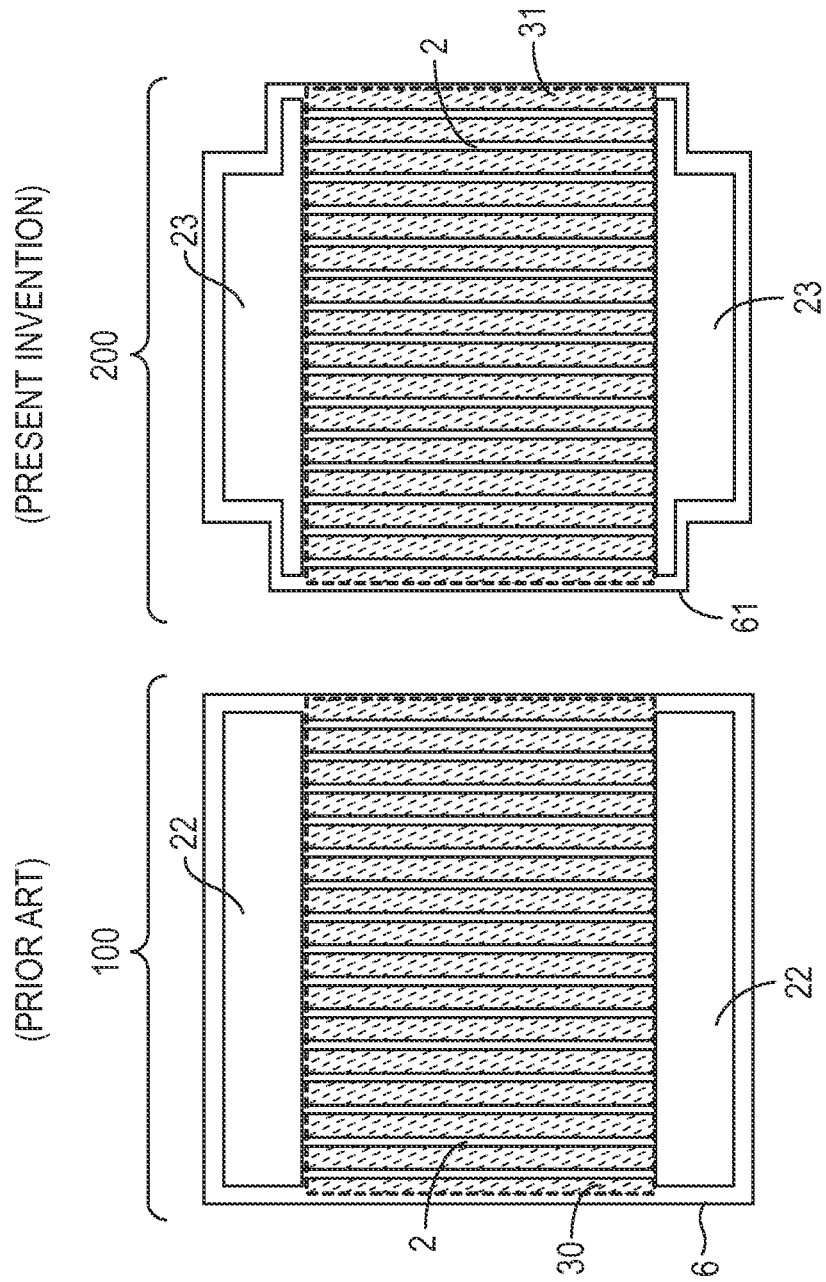
FIG. 4B compares a prior art solar cell 100 and a solar cell 200 made according to certain embodiments of present invention. The active areas 30 and 31 are the same in both cases, yielding the same amount of power from both devices.

In the present invention some or all of epitaxial layers at one or more corners of the die are removed to provide access to the substrate and/or the interjunction regions. Referring to FIGS. 4A and 4B, a clipped mesa structure 61 is provided such that exposed areas 88 are formed in the corner regions of the die on the wafer. The exposed areas 88 are provided in addition to the mesa isolation regions 8 in prior art solar cells; however, the number of die yielded from the wafer is the same. The busbars 23 are also clipped such that they are contained entirely within the clipped mesa area 61. Despite the changes in the layout, the active area 31 (area within dashed lines) of the solar cell 200 made according to the present invention is the same as the active area 30 (area within dashed lines) of the prior art solar cell 100. In the present invention the exposed corner regions 88 are provided without reducing the number of die yielded per wafer; and, without changing the power output of the solar cell.

Figure 1A:
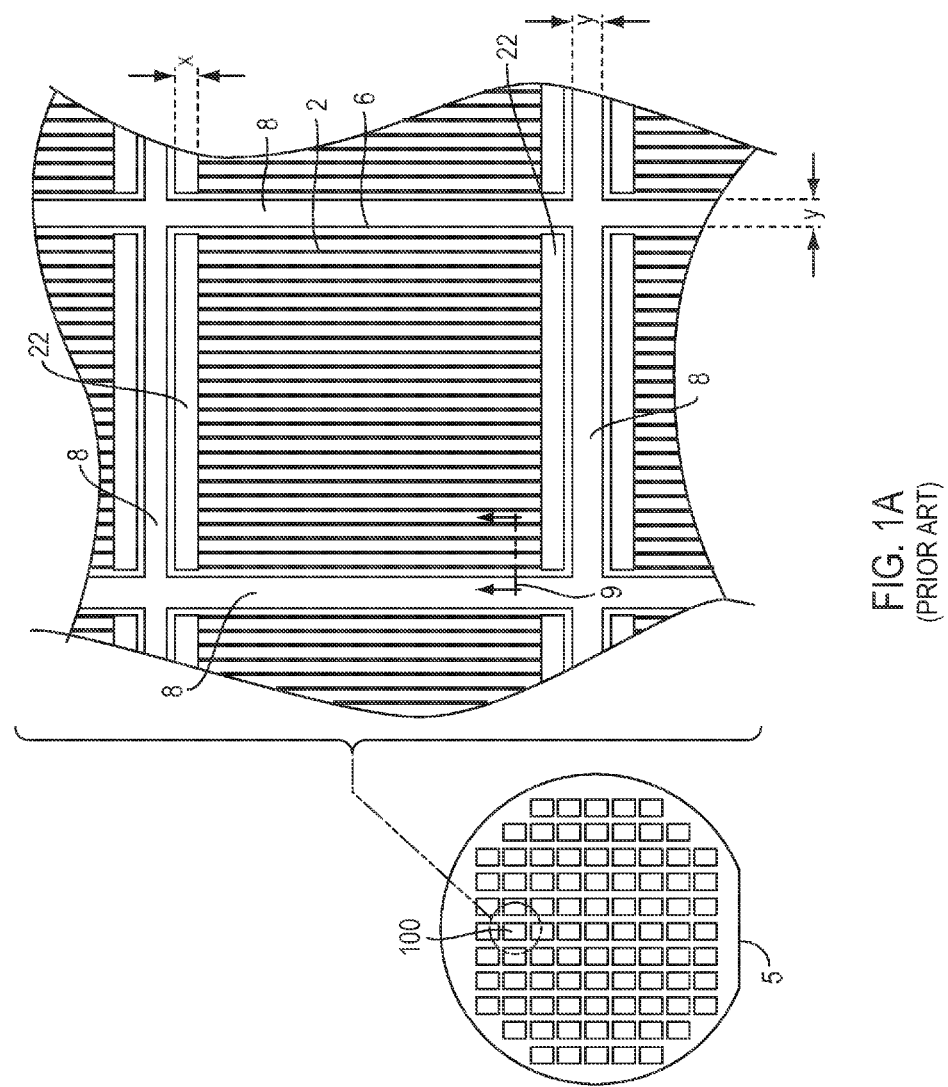
FIG. 1A is a plan view of a typical prior art solar cell 100 before singulation.
Figure 1B:
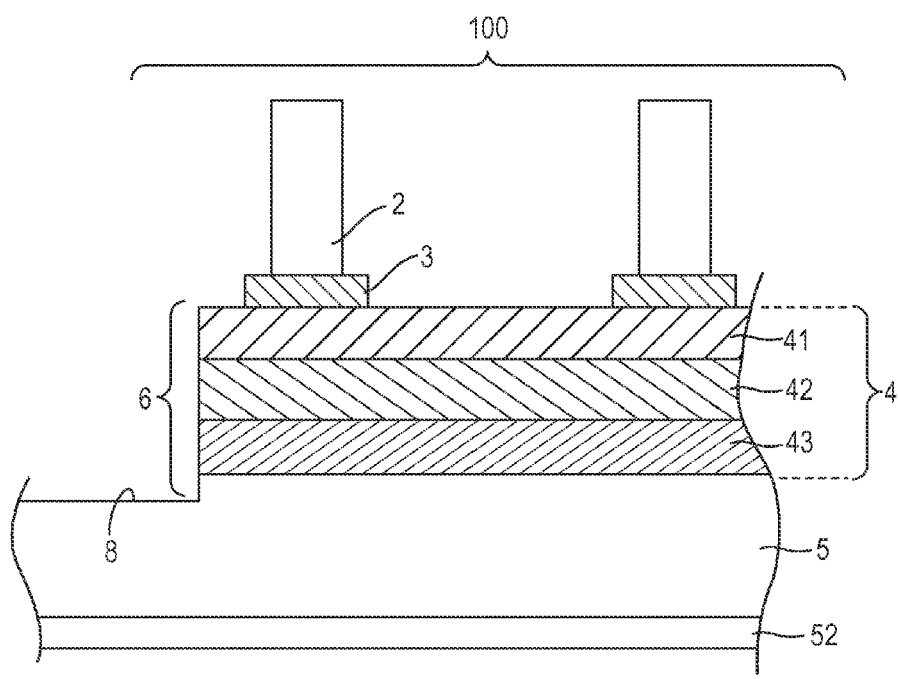
FIG. 1B is a side view of the cross-section 9 in FIG. 1A.
Figure 2:
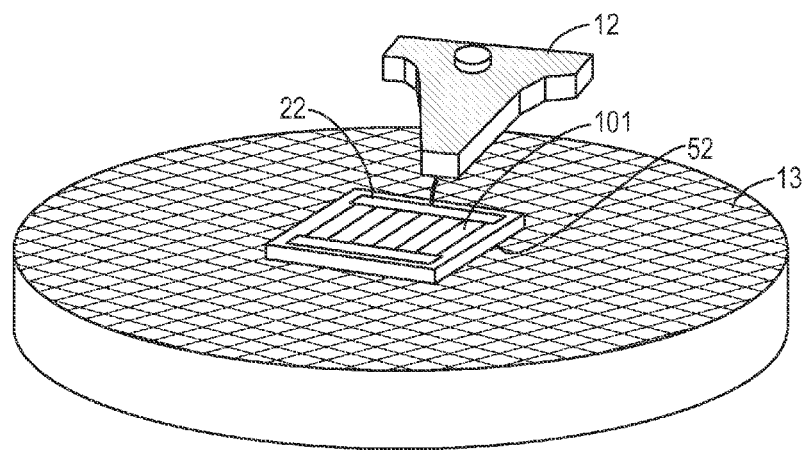
FIG. 2 is a schematic of a singulated prior art solar cell chip 101 on a vacuum chuck 13. The solar cell is contacted from the top by a probe 12.
Figure 3:
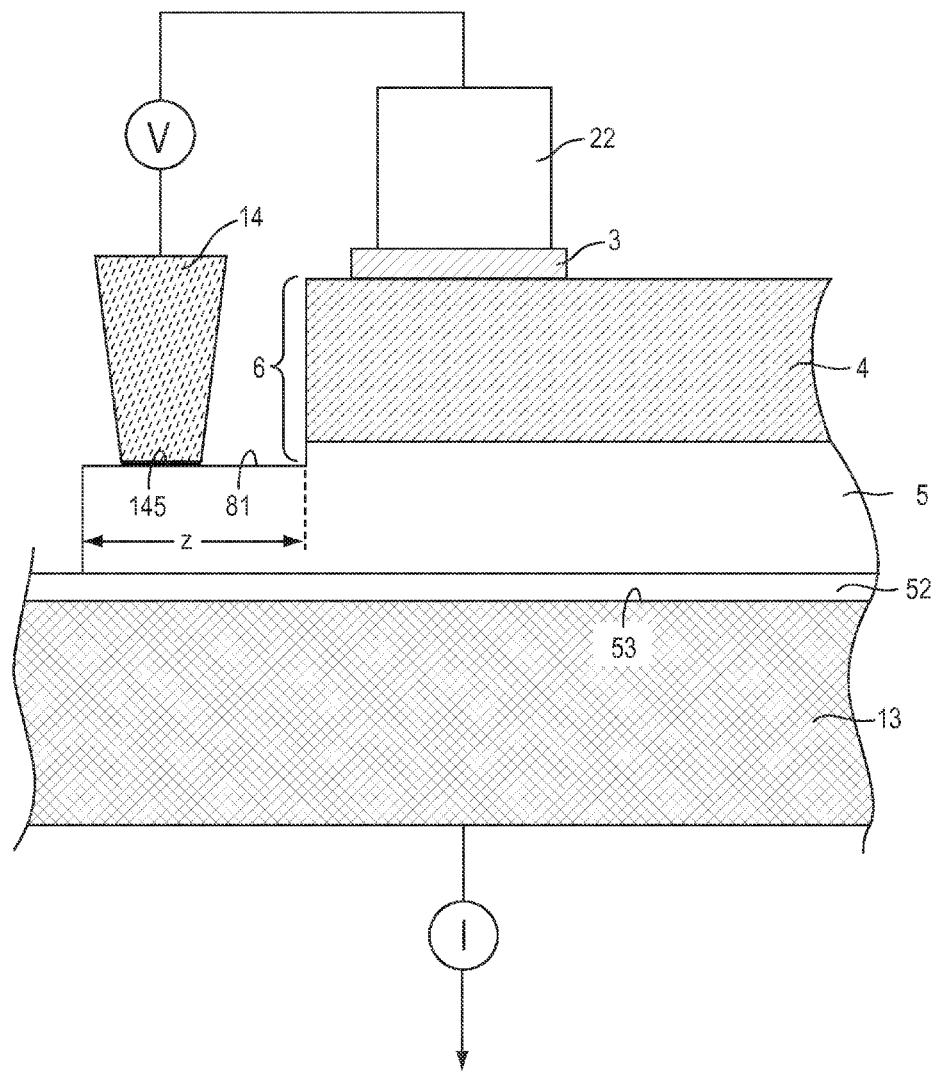
FIG. 3 is a cross-sectional schematic of a singulated prior art solar cell chip 101 on a vacuum chuck 13, illustrating contacting the substrate 5 from the top in the exposed areas 81 with a probe 14 for voltage measurements.
Figure 4C:
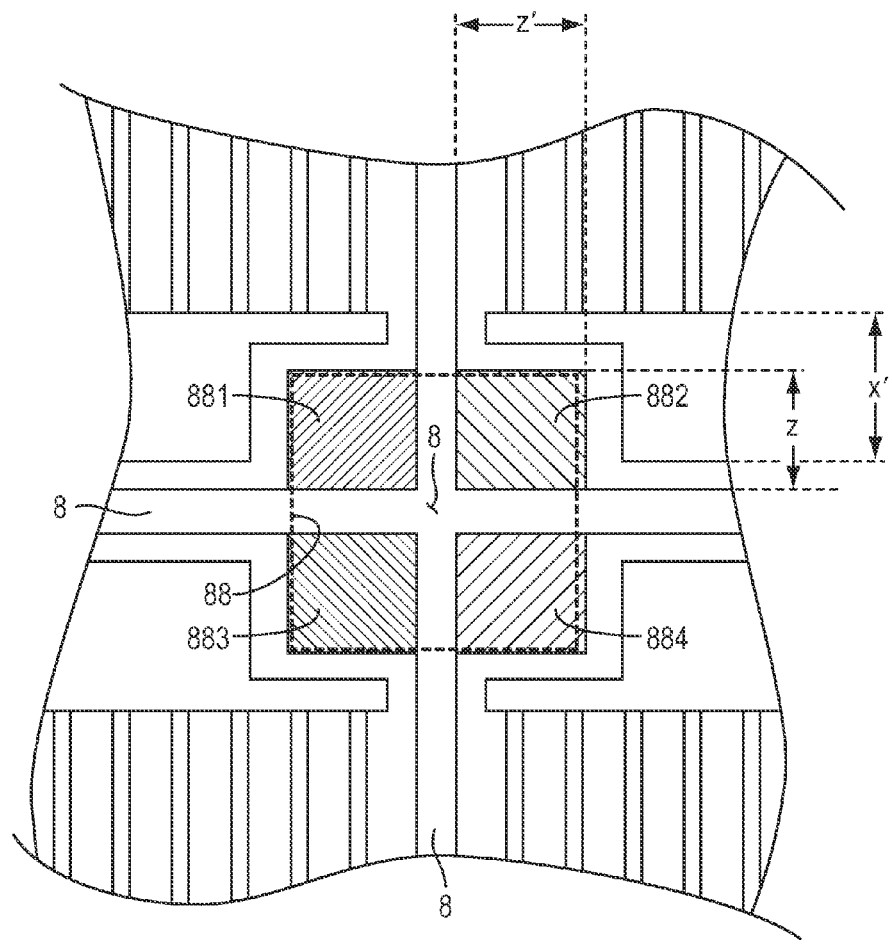
FIG. 4C shows the plan view of an exposed area 88.

As shown in FIG. 4C, the exposed corner regions 88 can be provided in several of ways, depending on the device regions exposed therein. Each of the clipped corners 881, 882, 883, and 884, also referred to herein as exposed corner regions, can be exposed by removing
    the uppermost epitaxial region 41,
    multiple epitaxial regions, all epitaxial regions 4, or all epitaxial regions 4 and some portion of the underlying substrate 5 (FIG. 1B).

For the exposed corner regions 881-884, the top junction 41 can be removed. In the regions 8 between the exposed corner regions 881-884, the junctions are removed through a mesa isolation etch and the underlying substrate (or a conductive epitaxial region thereon) is exposed. Depending on how much epitaxial material is removed from each of the exposed corner regions 881-884, a variety of configurations can be achieved:

When all four exposed corner regions 881-884 are level with the mesa isolation regions 8, the entire area of the exposed region 88 can be used for probing.

When each of the exposed corner regions 881-884 expose a different inter-junction region; the contacts placed in those regions can be used for measuring the voltage characteristics of individual junctions.

The exposed corner regions 881-884 can be used to contact the substrate 5 and/or inter junction regions from the top for voltage measurements both before and after singulation.

In embodiments of the present invention clipped mesa structures 61, clipped busbars 23, and exposed corner regions 881-884 can be realized by using standard semiconductor fabrication techniques. Specifically, after the semiconductor epitaxial deposition step the following steps can be realized:

1. Busbars 23 can be deposited according to a clipped busbar pattern.
2. Mesa isolation is done using a mesa pattern.
3. The corner regions of the mesa are etched to form the exposed corner regions 881-884. Step 3 can be realized in several ways such as, for example:

Etching each exposed corner regions 881-884 separately, using separate lithography steps, Etching some of the exposed corner regions 881-884 together using a single lithography step.

Etching all of the exposed corner regions 881-884 together using a single lithography step.

Exposing the exposed corner regions 881-884 during the mesa isolation step by using a clipped mesa pattern. In the latter case, the isolation regions 8 and the exposed corner regions 881-884 can be etched together in a single lithography step, thereby providing a level surface in the entirety of the exposed region 88.

Figure 5:
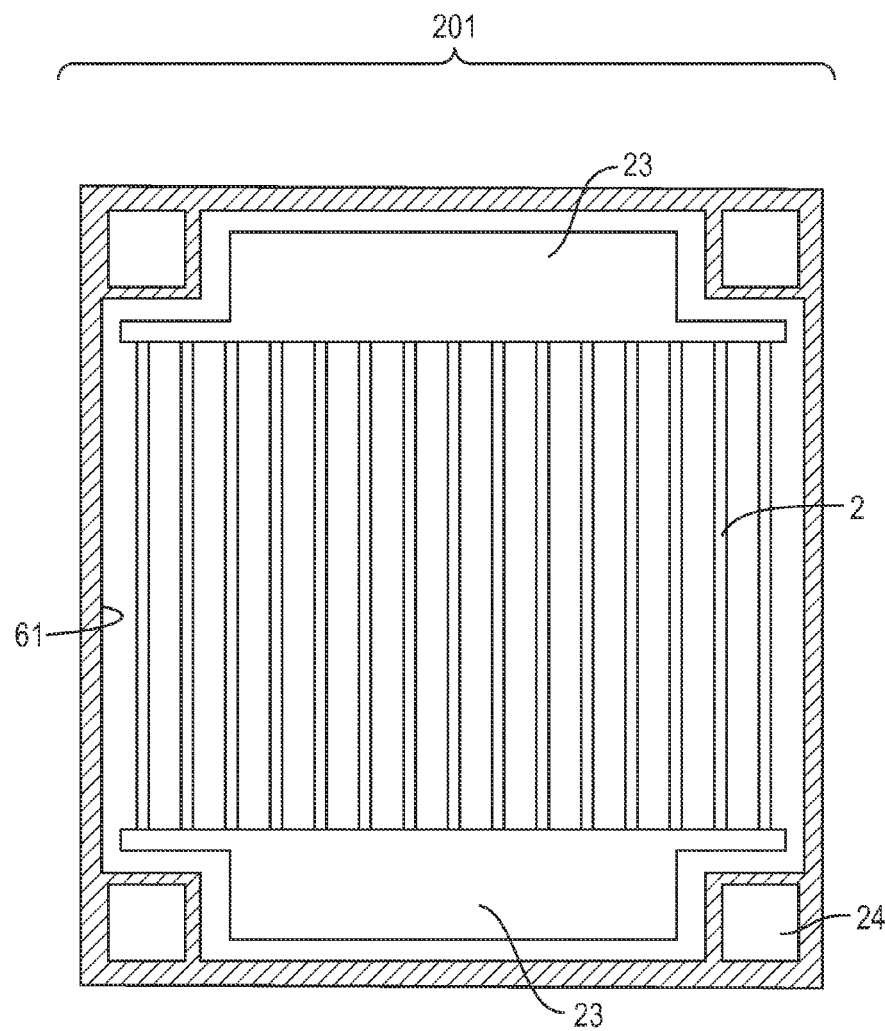
FIG. 5 shows a singulated solar cell 201 made according to certain embodiments of present invention, wherein metal contacts 24 are provided in the exposed areas in the corners.

4. Referring to FIG. 5, in certain embodiments, metal contacts 24 can be provided on the exposed corner regions 881-884. This step can be accomplished, for example, (a) by using separate lithography and metallization steps for each contact, (b) by metallizing some or all of the contacts together, or (c) by metallizing some or all of the contacts together with the busbar 23 metallization step in a single lithography step.

Standard semiconductor processes can be used to realize the steps 1 through 4. These steps are merely the basic process steps encompassed by certain embodiments of the present invention and the order they are executed can be varied. It is to be understood that there can be intervening and/or additional semiconductor processing steps.

In certain embodiments of the present invention, the exposed region 88 can provide enlarged regions that can be used to measure voltage both before and after singulation. Probing for voltage measurements occur only on the top side of the chip and hence the uncertainty in voltage measurement (resulting from voltage drop across the chip-vacuum chuck interface and on the vacuum chuck itself) can be eliminated or substantially reduced. It should be noted that the substrate and the inter-junction regions (if exposed) can be probed directly, without an intervening metal contact region 24, provided probe pins with appropriate work functions are used to create ohmic contacts. Therefore, the metal contact regions 24 are optional in certain embodiments of the present invention. Using the voltage measurement configuration of certain embodiments of the present invention, the current flowing through the contact pins will be very small and hence the voltage uncertainty due to contact resistance will also be reduced. Therefore, unlike the prior art configuration wherein back contacts are used for voltage measurements, a larger contact resistance may be tolerated without significantly affecting the voltage measurements.

In certain embodiments of the present invention the exposed corner regions 881-884 may be used for low-current measurements as well, in addition to voltage measurements. For example 1-sun current-voltage characteristics and quantum efficiency measurements may be done by accessing the chip from the top only. In such measurement configurations the back side of the chip need not be accessed and a back metal contact 52 is not needed. Consequently, in process flows where the substrate is thinned down before back metallization, certain electrical characterization tests can be conducted before the substrate thinning step.

In certain embodiments of the present invention current generation is eliminated or reduced near the corners of the chips. Therefore, the corners will stay at a lower temperature compared to the remainder of the chip. Consequently thermal runaway problems due to imperfect alignment of the chip on the heatsink are reduced or eliminated.

The certain embodiments of present invention eliminates or mitigates the following problems associated with prior art methods:

1. Embodiments of present invention provide probing area on the wafer surface for probing the substrate and/or the interconnection regions between the junctions without compromising the electrical power output from the solar cells or reducing the number of cells yielded from a wafer.
2. The interface regions between the junctions can be probed to measure the voltage contribution of individual junctions.
3. The ability to probe the substrate from the top side facilitates voltage measurement procedures, since only the front side of the wafer needs to be accessed.
4. The probing regions provided as a result of embodiments of the present invention can be used as current probes as well for certain electrical measurements such that a back contact 52 is not used.
5. Embodiments of present invention reduces or eliminates thermal runaway problems by eliminating or reducing the current flowing near chip corners.

Other benefits from the invention will be readily apparent to those skilled in the art.

Figure 6:
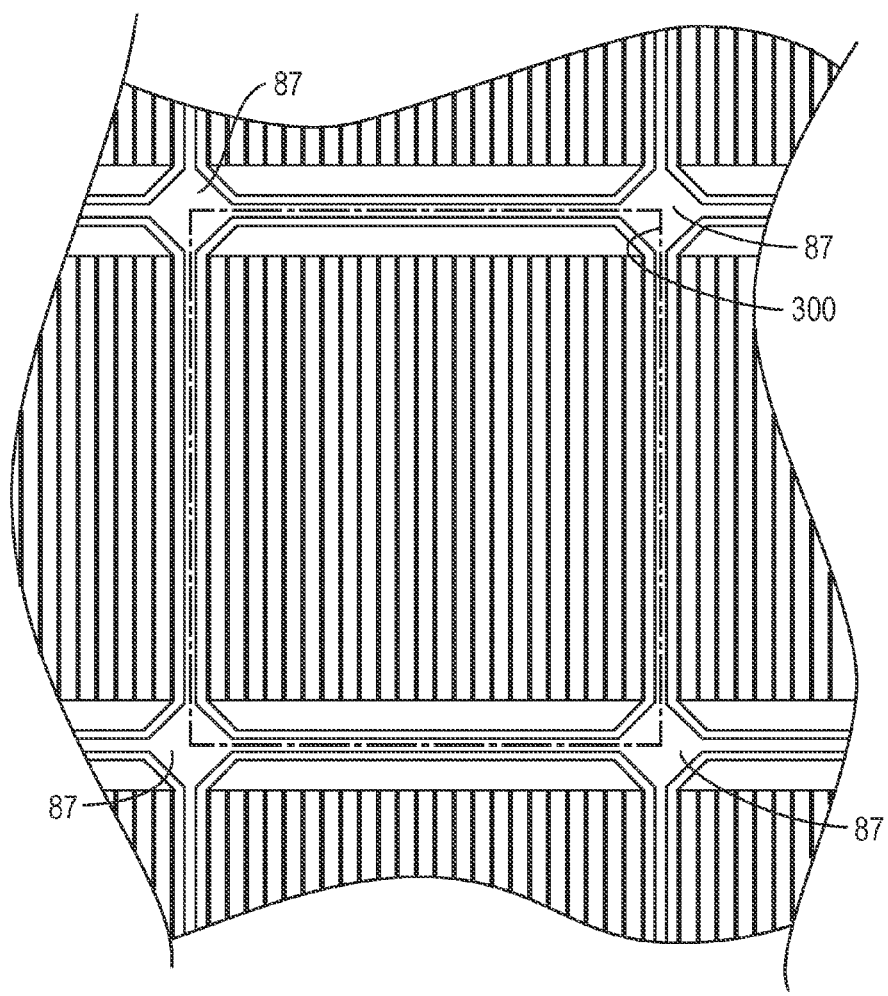
FIG. 6 shows one embodiment of the present invention, wherein the exposed corner regions 87 are diagonal.
Figure 7:
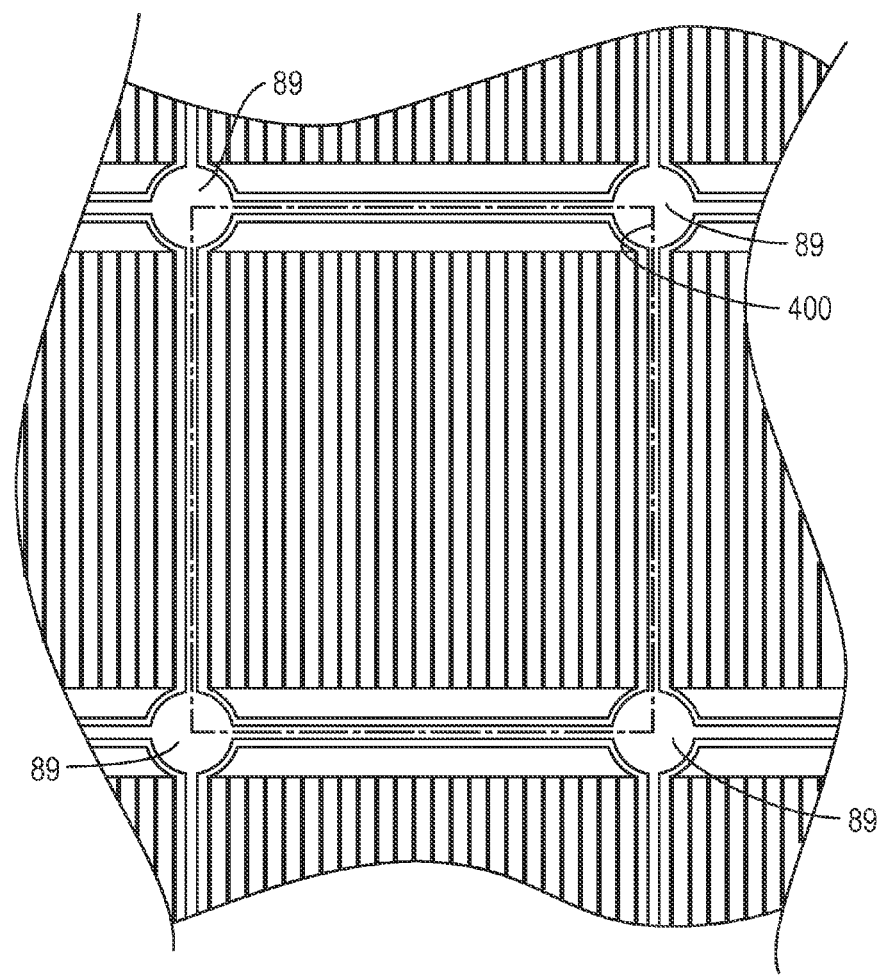
FIG. 7 shows another embodiment of the present invention, wherein the exposed corner regions 89 are circular.

The configurations discussed and shown herein, which are illustrated by square-shaped exposed areas 88, are not intended to be limiting. Those skilled in the art will recognize that semiconductor masks can be patterned in a number of configurations to serve the same purpose. For example, in the embodiments shown in FIGS. 6 and 7, the exposed corner regions 87 and 89 have diagonal and circular shapes, respectively (before singulation). In certain embodiments the dimensions z and z' of the clipped corners are on the order of magnitude of the busbar width x' (FIG. 4C). Likewise, the metal pads 24 (FIG. 5) can exhibit a variety of shape factors.

Figure 8:
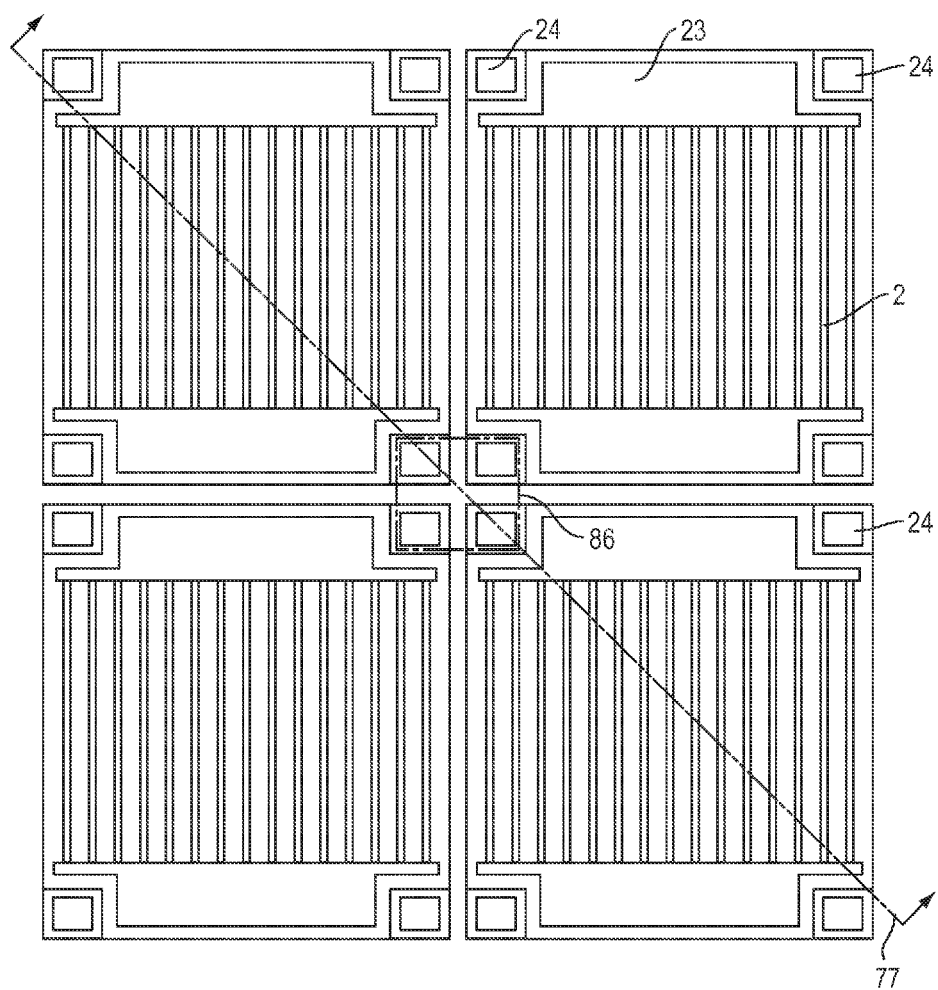
FIG. 8 shows another embodiment of the present invention wherein epitaxial regions are partially or fully removed from the corners to give electrical access to the interjunction regions (in addition to the substrate) for voltage measurements.

FIG. 8 shows one embodiment of the present invention wherein metal contacts 24 are provided in the etched corner regions 86. A number of different configurations and device functionalities can be achieved by removing a different amount of epitaxial material from each corner of each die, such that some or all inter junction regions and the substrate are exposed.

Figure 9A:
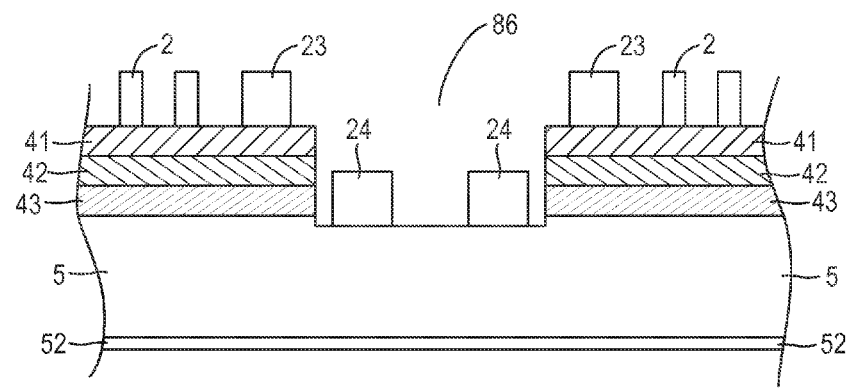
FIG. 9A shows a side view of the cross-section 77 in FIG. 8 for one embodiment of the present invention, wherein all of the epitaxial regions are removed in the corners to expose the substrate and the metal regions 24 make electrical contact to the substrate.

FIG. 9A is a side view of the cross-section 77 in FIG. 8 and shows another embodiment of the present invention. In this embodiment, the exposed region 86 is uniformly etched down to the substrate and all metal regions 24 within the region 86 are in contact with the substrate 5.

Figure 9B:
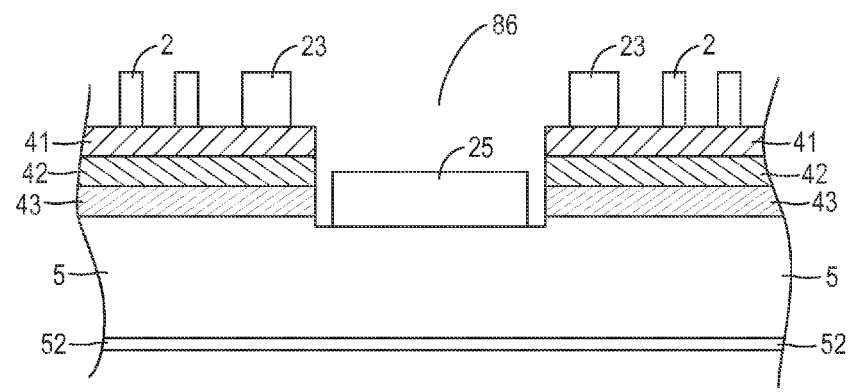
FIG. 9B shows a side view of the cross-section 77 in FIG. 8 for another embodiment of the present invention, wherein all of the epitaxial regions are removed in the corners to expose the substrate and a single contact pad 25 is placed in the exposed region 88 (FIG. 4A) to be used in wafer-level testing.

FIG. 9B shows another variation of the embodiment shown by FIG. 9A. In this embodiment a single contact pad 25 is provided in the exposed area 86 to facilitate probing.

Figure 9C:
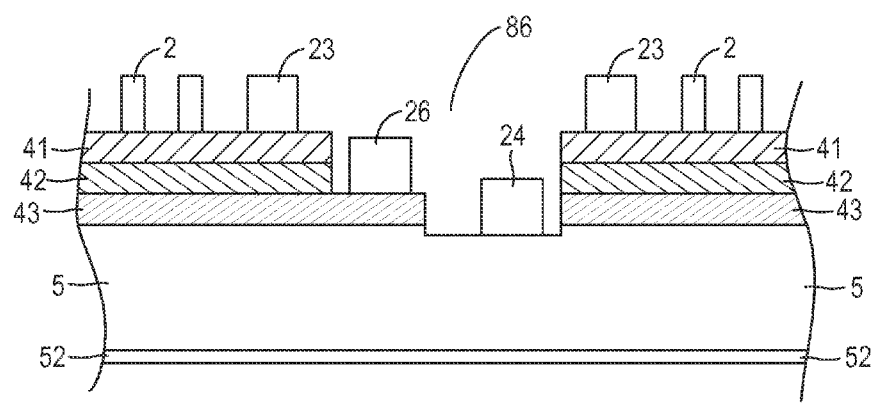
FIG. 9C shows a side view of the cross-section 77 in FIG. 8 for another embodiment of the present invention, wherein the metal contact region 26 is in contact with the interjunction region between junctions 42 and 43, whereas the metal contact region 24 makes contact to the substrate from the top.

FIG. 9C shows another embodiment of the present invention wherein a metal region 26 is in contact with an interjunction region between junctions 42 and 43 and the metal region 24 is in contact with the substrate 5.

Figure 9D:
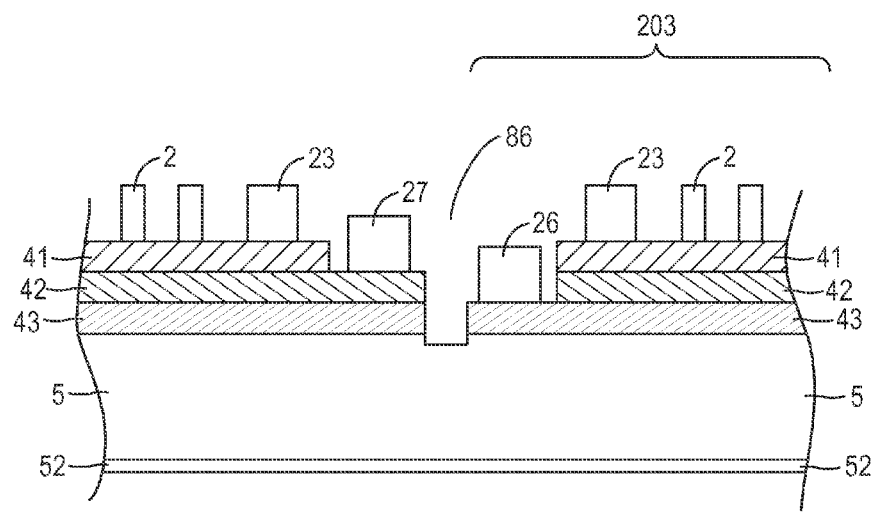
FIG. 9D shows a side view of the cross-section 77 in FIG. 8 for another embodiment of the present invention, wherein the metal contact region 26 is in contact with the interjunction region between junctions 42 and 43, whereas the metal contact region 27 is in contact with the interjunction region between junctions 41 and 42.

FIG. 9D shows another embodiment of the present invention wherein the metal region 26 is in contact with the inter junction region between junctions 42 and 43 and the metal region 27 is in contact with the inter junction region between junctions 41 and 42.

Figure 10:
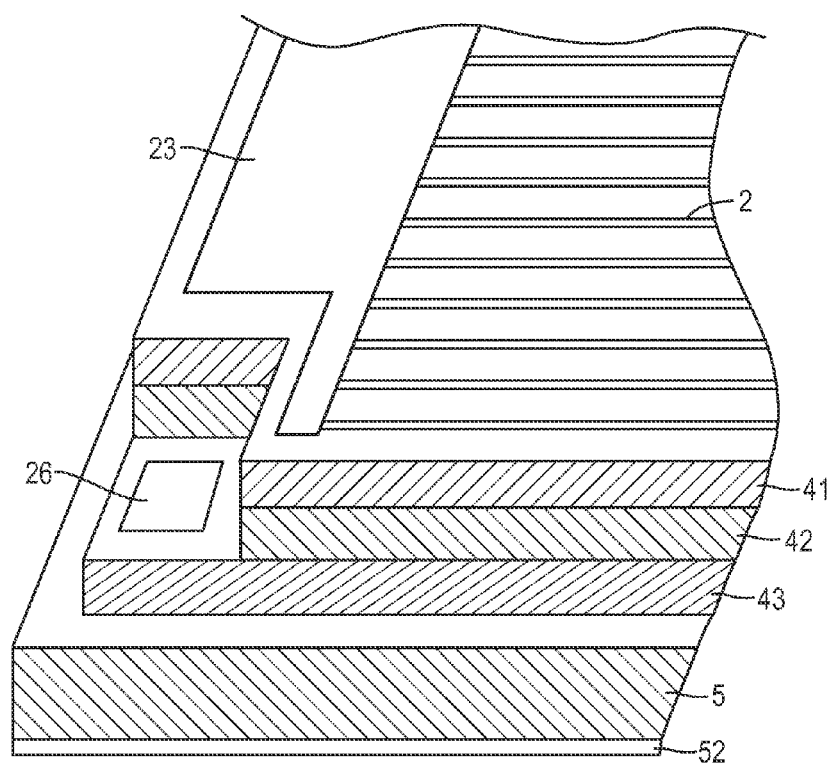
FIG. 10 shows an elevated side view of a solar cell device (after singulation) made according to the present invention wherein the metal contact region 26 is in contact with the interjunction region between junctions 42 and 43.

FIG. 10 shows perspective view of solar cell 203 (FIG. 9D) after singulation. Contact region 26 can be used to probe the inter junction region between junctions 42 and 43.

Figure 11:
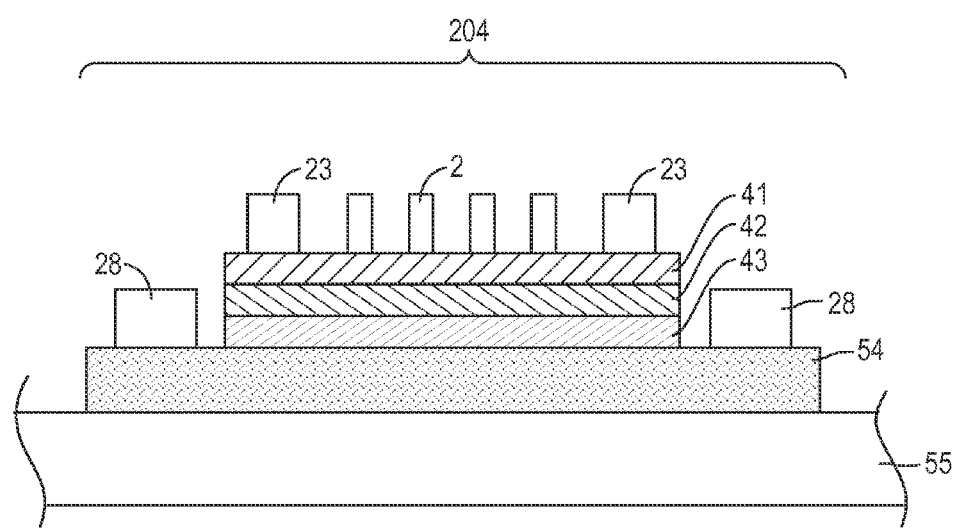
FIG. 11 shows another embodiment of the present invention wherein a conduction region 54 is provided between the substrate 55 and the epitaxial regions 41, 42, and 43. The contact regions 28 (located in the corners of the chips) provide electrical contact to the conduction region 54.

FIG. 11 shows another embodiment of the present invention wherein a conductive semiconductor region 54 (with no rectifying elements) is provided between the junction 43 and the substrate 55. Substrate 55 can be an insulating substrate on which the epitaxial regions 54, 43, 42, and 41 are grown. Alternatively, epitaxial regions 54, 43, 42, and 41 can be grown on another substrate (not shown) and transferred onto the substrate 55. The metal contact regions 28 in the corners of the solar cell device 204 provide electrical contact to the bottom junction 43 via the conductive region 54. Contact regions 28 serve as both current and voltage probes. Henceforth, all electrical measurements of the solar cell 204 can be done from the top side only.

Figure 12:
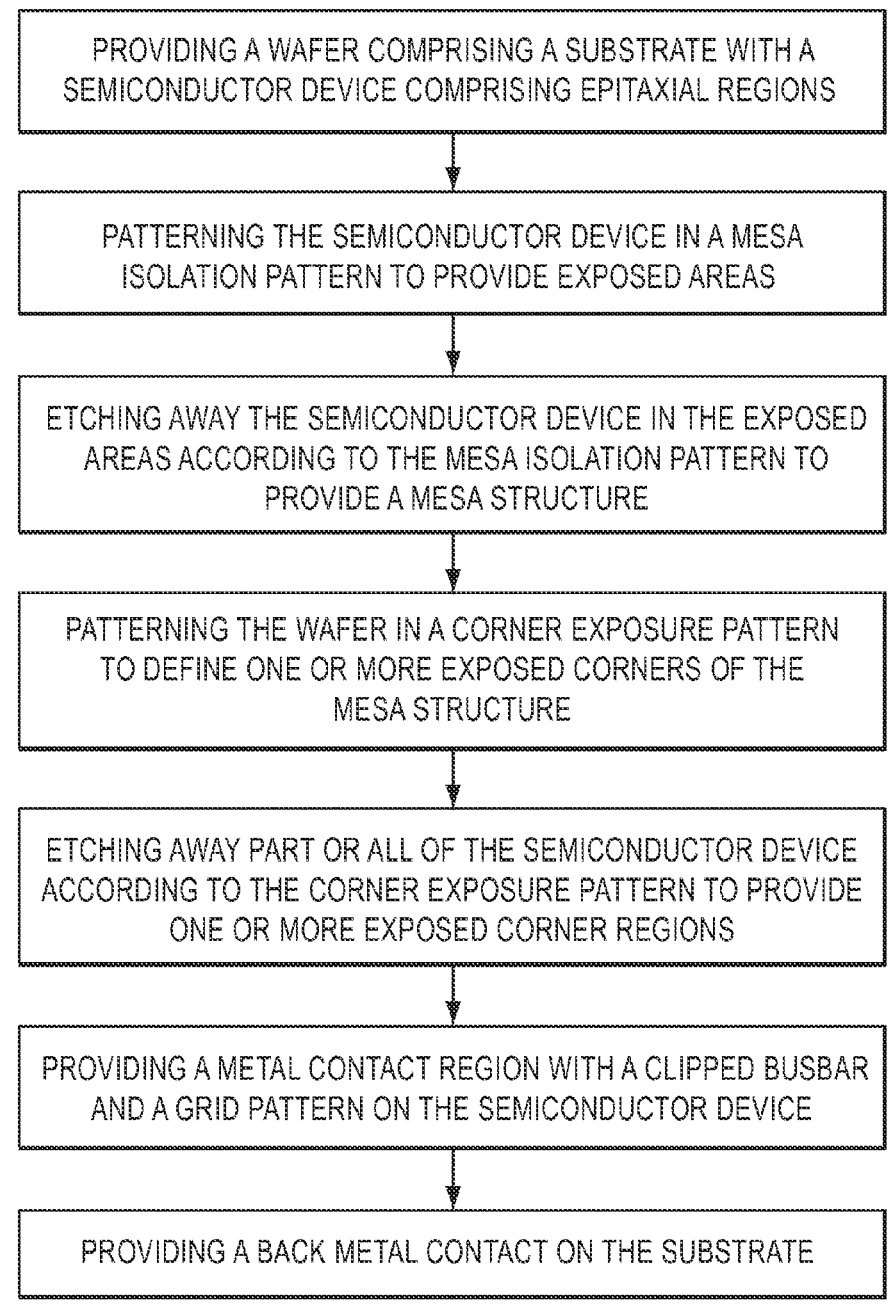
FIG. 12 shows a flow diagram summarizing process steps according to certain embodiments.

A flow diagram summarizing certain process steps consistent with methods provided by the present disclosure are provided in FIG. 12.

Although multi-junction solar cells such as III-V solar cell are disclosed herein, the structures and methods of the invention are also explicitly contemplated for any other semiconductors that draw considerable current throughout the device area, including semiconductors used for other applications and in other fields such as electronic integrated circuits and microprocessor chips. The invention herein can also be applied to cells with intra-stack contacts (e.g. multi-terminal solar cells), or to chips having different grid layout, so that epitaxy and/or metal can be removed from chip corners. In addition, the invention herein can also be applied to "inverted metamorphic" devices, or, in general, devices where the epitaxial layers are transferred from a growth substrate to a new substrate.

While the foregoing written description of the invention will enable one skilled in the art to make and use the invention, those skilled will understand and appreciate the number of variations, combinations, and equivalents of the specific embodiment, method, and examples herein. The invention should therefore not be limited by the above described embodiments, methods, and examples, but by all embodiments and methods within the scope and spirit of the invention.

What is claimed is:

1. A method for making a multi-junction solar cell comprising:
providing a multi-junction solar cell comprising:
a substrate comprising a top surface and a bottom surface; and
two or more junctions overlying the top surface of the substrate, wherein each of the two or more junctions is configured to absorb a different portion of the solar spectrum and each of the two or more junctions comprises an uppermost n-type region;
patterning the multi-junction solar cell in a mesa isolation pattern to provide exposed areas;
etching away the multi-junction solar cell in the exposed areas according to the mesa isolation pattern to provide a mesa structure;
patterning the multi-junction solar cell in a corner exposure pattern to define one or more exposed corners regions of the mesa structure;
etching away part or all of the multi-junction solar cell according to the corner exposure pattern to provide a clipped mesa structure comprising one or more exposed corner regions, wherein the one or more exposed corner regions comprises an exposed substrate region, an exposed uppermost n-type region, or both an exposed substrate region and an exposed uppermost n-type region; and
providing one or more metal contacts on the exposed substrate region, the exposed uppermost n-type region, or both the exposed substrate region and the exposed uppermost n-type region, wherein each of the one more metal contacts is characterized by dimensions less than dimensions of the clipped mesa structure.

2. The method of claim 1, wherein the one or more exposed corner regions comprises an exposed substrate region.

3. The method of claim 1, comprising:
providing a clipped busbar and a grid pattern overlying the two or more junctions; and
providing a back metal contact on the bottom surface of the substrate.

4. The method of claim 3, wherein each of the one or more exposed corner regions is characterized by dimensions z and z', wherein dimensions z and z' are less than a width of the clipped busbar.

5. The method of claim 1, wherein each of the one or more exposed corner regions is characterized by dimension z and z', wherein dimensions z and z' are greater than 25 micrometers.

6. The method of claim 1, wherein each of the one or more exposed corner regions is characterized by the dimension z and z', wherein dimensions z and z' are between 250 micrometers and 600 micrometers.

7. The method of claim 1, wherein etching away part or all of the multi-junction solar cell according to the corner exposure pattern comprises exposing one or more uppermost n-type regions.

8. The method of claims 1, wherein providing one or more metal contacts comprises providing more than one metal contact within the one or more of the exposed corner regions.

9. The method of claim 1, wherein providing one or more metal contacts comprises providing a single metal contact within adjacent exposed corner regions of adjacent clipped mesa structures.

10. A multi-junction solar cell comprising:
a substrate comprising a top surface and a bottom surface;
two or more junctions overlying the top surface of the substrate, wherein each of the two or more junctions is configured to absorb a different portion of the solar spectrum and each of the two or more junctions comprises an uppermost n-type region;

a clipped busbar overlying the two or more junctions, wherein the clipped busbar comprises a clipped mesa area;

a clipped mesa structure comprising one or more exposed corner regions, within the clipped mesa area, wherein, the one or more exposed corner regions comprises an exposed substrate region, an exposed uppermost n-type region or a combination thereof; and one or more metal contacts disposed on the exposed substrate region, the exposed uppermost n-type region, or both the substrate region and the exposed uppermost n-type region.

11. The multi-junction solar cell of claim 10, wherein the multi-junction solar cell further comprises:

one or more clipped busbars overlying the two or more junctions;

a grid pattern interconnected to the one or more clipped busbars; and a back metal contact underlying the bottom surface of the substrate.

12. The multi-junction solar cell of claim 10, wherein the one or more exposed corner regions comprises an exposed uppermost n-type region.

13. The multi-junction solar cell of claim 10, wherein the one or more exposed corner regions comprises an exposed substrate region.

14. The multi-junction solar cell of claim 10, wherein each of the one or more exposed corner regions comprises a metal contact.

15. The multi-junction solar cell of claim 10, comprising one or more clipped busbars overlying the two or more junctions; and wherein the clipped mesa structure is characterized by dimensions z and z', and wherein dimensions z and z', are less than dimensions of the one or more clipped busbars.

16. The multi-junction solar cell of claim 15, wherein the dimensions z and z' are greater than 25 micrometers.

17. The multi-junction solar cell of claim 15, wherein the dimensions z and z' are between 250 micrometers and 600 micrometers.

* * * * *